(12) United States Patent
Lee et al.

(10) Patent No.: US 8,956,181 B2
(45) Date of Patent: Feb. 17, 2015

(54) CONNECTION STRUCTURE BETWEEN SUBSTRATE AND FPCB FOR TOUCH PANEL

(71) Applicant: Samsung Electro-Mechanics Co., Ltd., Gyunggi-do (KR)

(72) Inventors: Seung Min Lee, Gyunggi-do (KR); Young Jae Kim, Gyunggi-do (KR); Ha Yoon Song, Gyunggi-do (KR); Ho Joon Park, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 119 days.

(21) Appl. No.: 13/713,968

(22) Filed: Dec. 13, 2012

(65) Prior Publication Data

US 2013/0154719 A1    Jun. 20, 2013

(30) Foreign Application Priority Data

Dec. 16, 2011 (KR) .................. 10-2011-0136608

(51) Int. Cl.
  *H01R 12/24* (2006.01)
  *H03K 17/96* (2006.01)
  *G06F 3/041* (2006.01)

(52) U.S. Cl.
  CPC ............ *H03K 17/9618* (2013.01); *G06F 3/041* (2013.01); *G06F 2203/04103* (2013.01)
  USPC .......................................... 439/496; 439/67

(58) Field of Classification Search
  CPC ......... H01R 12/78; H01R 12/79; H01R 12/62
  USPC .............................. 439/67, 77, 492, 493, 496
  See application file for complete search history.

(56) References Cited

U.S. PATENT DOCUMENTS

| | | | | |
|---|---|---|---|---|
| 3,158,421 A | * | 11/1964 | Hasenauer, Jr. | 439/493 |
| 3,319,216 A | * | 5/1967 | McCullough | 439/493 |
| 3,401,369 A | * | 9/1968 | Roche et al. | 439/62 |
| 3,425,021 A | * | 1/1969 | Fow et al. | 439/59 |
| 4,111,510 A | * | 9/1978 | Zurcher | 439/67 |
| 4,802,866 A | * | 2/1989 | Balzano et al. | 439/496 |
| 4,907,975 A | * | 3/1990 | Dranchak et al. | 439/67 |
| 4,911,643 A | * | 3/1990 | Perry et al. | 439/67 |
| 5,044,980 A | * | 9/1991 | Krumme et al. | 439/496 |
| 5,163,835 A | * | 11/1992 | Morlion et al. | 439/67 |
| 5,427,533 A | * | 6/1995 | Chambers | 439/62 |
| 6,024,580 A | * | 2/2000 | Dangler et al. | 439/67 |
| 8,727,793 B2 | * | 5/2014 | Cafiero et al. | 439/76.1 |

FOREIGN PATENT DOCUMENTS

KR    1020110107590    12/2011

* cited by examiner

*Primary Examiner* — Thanh Tam Le
(74) *Attorney, Agent, or Firm* — Ladas & Parry, LLP

(57) ABSTRACT

Disclosed herein is a connection structure between a substrate and a flexible printed circuit board (FPCB) for a touch panel, including: a substrate; first sensing electrodes; second sensing electrodes; first electrode wirings; second electrode wirings; and a flexible printed circuit board connected to the substrate so as to be electrically connected to the first and second electrode wirings, wherein a first connection portion of the first electrode wiring and a second connection portion of the second electrode wiring to which the flexible printed circuit board is electrically connected are formed on the upper and lower surfaces of the substrate, respectively, so as to face each other in a vertical direction. Therefore, the flexible printed circuit substrate may be connected to the substrate by a single assembling process.

9 Claims, 3 Drawing Sheets

CONNECTION STRUCTURE BETWEEN SUBSTRATE AND FPCB FOR TOUCH PANEL

CROSS REFERENCE TO RELATED APPLICATION

This application claims the benefit of Korean Patent Application No. 10-2011-0136608, filed on Dec. 16, 2011, entitled "Connection Structure of Substrate and FPCB for Touch Panel", which is hereby incorporated by reference in its entirety into this application.

BACKGROUND OF THE INVENTION

1. Technical Field

The present invention relates to a connection structure between a substrate and a flexible printed circuit board (FPCB) for a touch panel.

2. Description of the Related Art

In accordance with the growth of computers using a digital technology, devices assisting computers have also been developed, and personal computers, portable transmitters and other personal information processors execute processing of text and graphics using a variety of input devices such as a keyboard and a mouse.

In accordance with the rapid advancement of an information-oriented society, the use of computers has gradually increased, and it is difficult to efficiently operate products only using a keyboard and mouse currently serving as an input device. Therefore, the necessity for a device that is simple, has less malfunction, and is capable of easily inputting information has increased.

In addition, techniques for input devices have progressed toward techniques related to high reliability, durability, innovation, designing and processing beyond a level of satisfying general functions. To this end, a touch panel has been developed as an input device capable of inputting information such as text, graphics, or the like.

The touch panel is mounted on a display surface of an image display device such as an electronic organizer, a flat panel display device including a liquid crystal display (LCD) device, a plasma display panel (PDP), an electroluminescence (EL) element, or the like, or a cathode ray tube (CRT) to thereby be used to allow a user to select desired information while viewing the image display device.

The touch panel is classified into a resistive type touch panel, a capacitive type touch panel, an electromagnetic type touch panel, a surface acoustic wave (SAW) type touch panel, and an infrared type touch panel.

These various types of touch panels are adapted for electronic products in consideration of a signal amplification problem, a resolution difference, a level of difficulty of designing and processing technologies, optical characteristics, electrical characteristics, mechanical characteristics, resistance to an environment, input characteristics, durability, and economic efficiency. Currently, the resistive type touch panel and the capacitive type touch panel have been prominently used in a wide range of fields.

As a specific example of a touch panel according to the prior art, there may be a touch panel disclosed in Korean Patent Laid-Opened Publication No. 10-2011-0107590.

Describing a structure of the touch panel disclosed in a description of the prior art in a content of Korean Patent Laid-Opened Publication No. 10-2011-0107590, the touch panel is configured to include a substrate, electrodes formed on the substrate, electrode wirings extended from the electrodes and gathered on one end of the substrate, and a controller connected to the electrode wirings through a flexible printed circuit board (hereinafter, referred to as 'FPCB').

Here, the FPCB serves to transfer signals generated in the electrode to the controller through the electrode wirings. Here, the FPCB and the electrode wirings may be certainly connected to each other in order to secure reliability of the signal transfer by the FPCB.

However, most of the touch panels according to the prior art including the touch panel disclosed in Korean Patent Laid-Opened Publication No. 10-2011-0107590 generally have a structure in which upper and lower substrates are coupled to each other. In this structure, connection portions of the electrode wirings to which the FPCB is connected are formed on each of the upper and lower substrates. In this case, the FPCB should be connected to each of the connection portions of the electrode wirings formed on the upper and lower substrates by a separate assembling process.

As described above, in the connection structure between the substrate and the FPCB in the touch panel according to the prior art, since the FPCB is connected to the connection portions of the electrode wirings formed on each of the plurality of substrates by a separate assembling process, there are problems that it is inconvenient to perform the assembling process, a lead time until the assembling process of the touch panel is completed is delayed, and an assembling device is added.

SUMMARY OF THE INVENTION

The present invention has been made in an effort to provide a connection structure between a substrate and a flexible printed circuit board (FPCB) for a touch panel in which a process of connecting the FPCB to the substrate may be completed as a single process.

According to a preferred embodiment of the present invention, there is provided a connection structure between a substrate and a flexible printed circuit board (FPCB) for a touch panel, including: a substrate; first sensing electrodes formed on an upper surface of the substrate; second sensing electrodes formed on a lower surface of the substrate; first electrode wirings formed on the upper surface of the substrate while being electrically connected to the first sensing electrodes; second electrode wirings formed on the lower surface of the substrate while being electrically connected to the second sensing electrodes; and a flexible printed circuit board connected to the substrate so as to be electrically connected to the first and second electrode wirings, wherein a first connection portion of the first electrode wiring and a second connection portion of the second electrode wiring to which the flexible printed circuit board is electrically connected are formed on the upper and lower surfaces of the substrate, respectively, so as to face each other in a vertical direction.

The first and second connection portions may be formed on upper and lower surfaces of a distal end portion of the substrate, respectively.

The flexible printed circuit board may include: a body part; and first and second connection parts extended integrally with each other from the body part and electrically connected to the first and second connection portions, respectively.

The flexible printed circuit board may include: an insulating part enclosing the outermost side; and first and second conductive parts formed in the insulating part and electrically connected to the first and second connection portions, respectively.

The flexible printed circuit board may further include: a first adhesive pad formed at an end portion of the first conductive part and adhered to a portion of the substrate at which the first connection portion is formed while being electrically connected to the first connection portion; and a second adhesive pad formed at an end portion of the second conductive part and adhered to a portion of the substrate at which the second connection portion is formed while being electrically connected to the second connection portion The connection structure may further include: a first depression part having the first connection portion formed thereon and depressed from the upper surface of the substrate in a thickness direction; and a second depression part having the second connection portion formed thereon and depressed from the lower surface of the substrate in the thickness direction.

The first and second connection parts may have widths corresponding to widths between both sidewalls of each of the first and second depression parts.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1A:
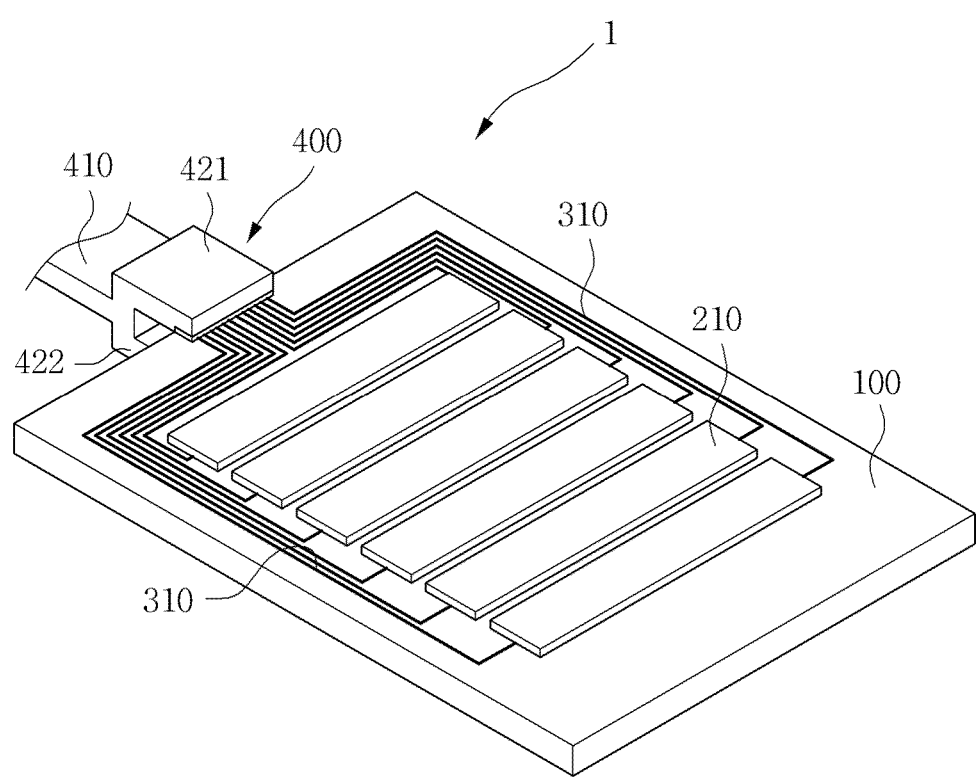
FIGS. 1A and 1B are perspective views showing a connection structure between a substrate and a flexible printed circuit board (FPCB) for a touch panel according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, a connection structure between a substrate and a flexible printed circuit board (FPCB) for a touch panel according to a preferred embodiment of the present invention will be described in detail with reference to the accompanying drawings.

Figure 1B:
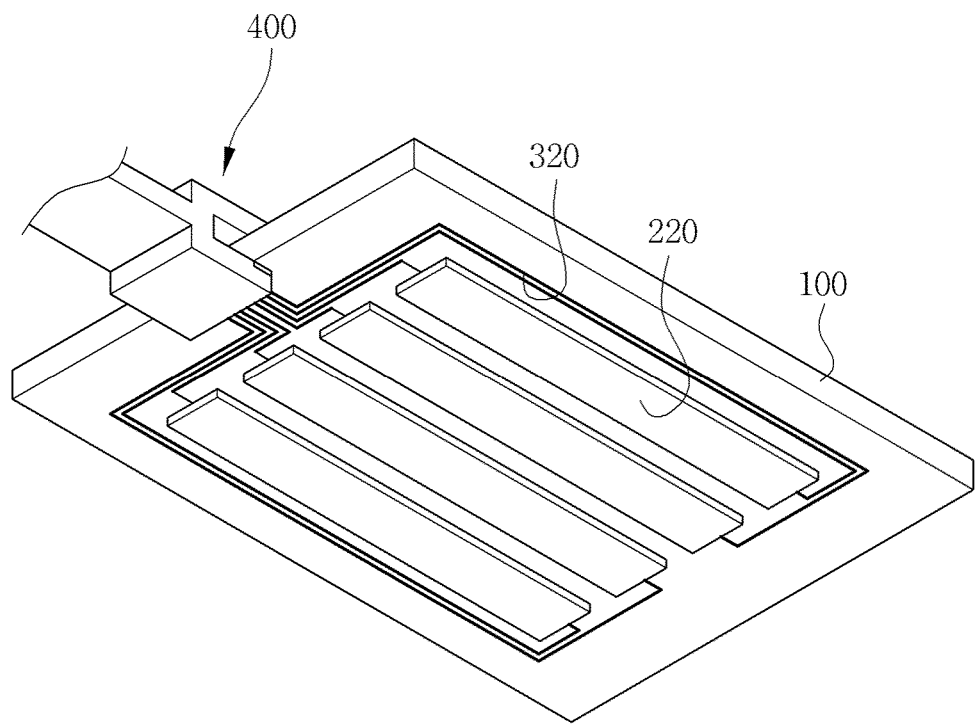
Figure 2:
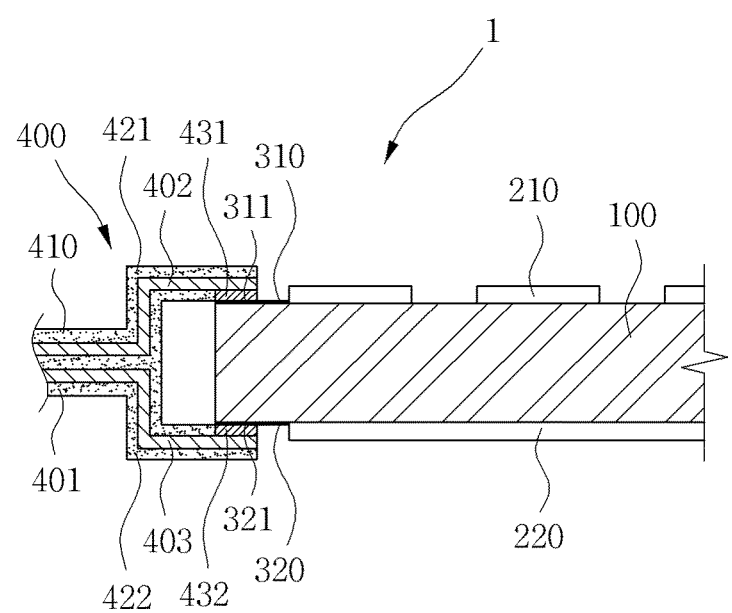
FIG. 2 is a side cross-sectional view of the connection structure shown in FIGS. 1A and 1B.

As shown in FIGS. 1A to 2, the connection structure 1 between a substrate and an FPCB for a touch panel according to the preferred embodiment of the present invention is configured to include a substrate 100, sensing electrodes, electrode wirings, and a flexible printed circuit board (hereinafter, referred to as a 'FPCB') 400.

The substrate 100, which is a portion corresponding to a body of the touch panel, provides a space on which sensing electrodes and electrode wirings to be described below are formed.

The substrate 100 may be made of a material such as polyethylene terephthalate (PET), polycarbonate (PC), poly methyl methacrylate (PMMA), polyethylene naphthalate (PEN), polyethersulfone (PES), a cyclic olefin polymer (COC), a triacetylcellulose (TAC) film, a polyvinyl alcohol (PVA) film, a polyimide (PI) film, polystyrene (PS), biaxially oriented polystyrene (BOPS; containing K resin), glass, tempered glass, or the like, so as to insulate first and second sensing electrodes 210 and 220 to be described from each other while securing transparency.

Here, in order to improve adhesion between the substrate and the sensing electrodes, high frequency treatment or primer treatment may be performed on the substrate 100.

The sensing electrode serves to generate a signal at the time of being touched by a user, thereby allowing a controlling unit (not shown) to recognize the touched position.

In the present embodiment, an example in which a single substrate is used and the sensing electrodes are formed on both surfaces of the single substrate rather than an example in which the sensing electrodes are not formed on each of a plurality of substrates is suggested.

As a specific example of the sensing electrodes, an example in which the sensing electrodes include first sensing electrodes 210 formed on an upper surface of the substrate 100 so as to have any one direction as a length direction and second electrodes 220 formed on a lower surface of the substrate 100 so as to have a direction perpendicular to the length of the first sensing electrodes 210 as a length direction is shown in FIGS. 1A to 2.

In the sensing electrodes formed as described above, for example, the first sensing electrodes 210 sense a touch position on an X axis, and the second electrodes 220 sense a touch position on a Y axis, thereby making it possible to allow the touch position to be confirmed by the controlling unit.

The sensing electrodes 210 and 220 may be made of a conductive polymer such as poly-3,4-ethylenedioxythiophene/polystyrenesulfonate (PEDOT/PSS), polyaniline, polyacetylene, polyphenylenevinylene, or the like, or a material such as an indium thin oxide, or the like.

Further, although an example in which the sensing electrodes 210 and 220 have a bar shape is shown in FIGS. 1A to 2, the sensing electrodes 210 and 220 are not limited to have the above-mentioned shape, but may also have various shapes.

The electrode wirings may allow electrical signals to be transferred between the above-mentioned sensing electrodes 210 and 220 and the controlling unit.

In the case in which the sensing electrodes include the first sensing electrodes 210 and the second electrodes 220 as described above as an example, the electrode wirings may include first electrode wirings 310 electrically connected to the first sensing electrodes 210 to allow the first sensing electrodes 210 and the controlling unit to be electrically connected to each other and second electrode wirings 320 electrically connected to the second sensing electrodes 220 to allow the second sensing electrodes 220 and the controlling unit to be electrically connected to each other.

The electrode wirings 310 and 320 may be formed on the substrate 100 by various printing methods such as a silk screen method, a gravure printing method, an inkjet printing method, or the like. In addition, as a material of the electrode wirings 310 and 320, silver (Ag) paste or organic silver having excellent electrical conductivity may be used. However, the electrode wirings 310 and 320 are not limited to being made of silver (Ag) paste or organic silver, but may be made of a conductive polymer, carbon black (including CNT), a metal oxide such as or ITO, or a low resistance metal material such metals, or the like.

Although the case in which the electrode wirings 310 and 320 are connected to both ends of the sensing electrodes 210 and 220 is shown in FIGS. 1A to 2, this is only an example. That is, the electrode wirings 310 and 320 may be connected to only one end of the sensing electrodes 210 and 220 according to a scheme of the touch panel.

Meanwhile, distal end portions of the electrode wirings 310 and 320 become connection portions electrically connected to an FPCB 400 to be described below. In other words, the connection portion of the electrode wiring, which is a portion of the electrode wiring, indicates a portion electrically connected to the FPCB 400. The first electrode wiring 310 and the second electrode wiring 320 have a first connection portion 311 and a second connection portion 321, respectively (See FIG. 2).

The connection portions 311 and 321 may be preferably positioned on a surface of a distal end portion of one side of the substrate 100 in order for the FPCB 400 connected to the connection portions 311 and 321 not to invade active regions on the substrate 100, that is, regions at which the sensing electrodes 210 and 220 are formed on the substrate 100 so as to recognize a touch of the user.

Since the electrode wirings 310 and 320 may be formed according to the number of sensing electrodes formed on the substrate 100, they may be formed as multiple strands on the substrate 100 as shown. In this case, in order for the FPCB 400 to be manufactured to have a narrow width, the electrode wirings 310 and 320, the electrode wirings 310 and 320 need to be formed so that each strand of the connection portions 311 and 321 is gathered on the substrate 100.

For this reason, an example in which each strand of the electrode wirings 310 and 320 is formed to be gathered on a surface of the center of a distal end portion of one side of the substrate 100 is shown in FIGS. 1A and 1B.

Meanwhile, in the connection structure 1 between a substrate and an FPCB for a touch panel according to the present embodiment, the first connection portion 311 of the first electrode wiring 310 described above and the second connection portion 321 of the second electrode wiring 320 described above are formed on the upper and lower surfaces of the substrate 100, respectively, so as to face each other in a vertical direction.

The reason why the first connection portion 311 and the second connection portion 321 are formed as described above is to allow an FPCB 400 to be described below to be connected to the substrate 100 by a single process, improve durability of the connection structure, and maintain reliability of an electrical connection state. A more detailed description thereof will be provided in a description of the FPCB 400.

The FPCB 400 is electrically connected to the connection portions 311 and 321 described above to electrically connect between the sensing electrodes 210 and the 220 and the controlling unit.

The FPCB 400 may include a body part 410 and first and second connection parts 421 and 422 branched from the body part 410 and extended integrally with each other from the body part 410, as shown, as a specific example.

Although not shown, one end portion of the body part 410 is electrically connected to the controlling unit. In addition, the first and second connection parts 421 and 422, which are extended integrally with each other from the body part 410, are formed while being branched into two branches at the other end portion of the body part 410.

The first connection part 421 is fixed to a portion of the upper surface of the substrate 100 at which the first connection portion 311 is formed while being electrically connected to the first connection portion 311. In addition, the second connection part 422 is fixed to a portion of the lower surface of the substrate 100 at which the second connection portion 321 is formed while being electrically connected to the second connection portion 321.

Meanwhile, the FPCB 400 may have an internal configuration as described in the following example.

The FPCB 400 may be made of an insulating material and be configured to include an insulating part 410 enclosing the outermost side of the body part 410, the first connection part 421, and the second connection part 422, a first conductive part 402 made of a conductive material and formed in the insulating part 401 so as to be connected from the body part 410 up to the first connection part 421, and a second conductive part 403 made of a conductive material and formed in the insulating layer 401 so as to be connected from the body part 410 up to the second connection part 422.

The insulating part 401 may be made of an insulating polymer material such as polyimide (PT), polyvinyl chloride (PVC), polyethylene (PE), or the like, and the first and second conductive parts 402 and 403 may be made of an electrically conductive metal such as gold, silver, copper, or the like, a metal oxide such as ITO, or a conductive polymer material.

An end portion of the first conductive part 402 positioned in the first connection part 421 is electrically connected to the first connection portion 311, and an end portion of the second conductive part 403 positioned in the second connection part 422 is electrically connected to the second connection portion 321. The first and second connection parts 421 and 422 may be formed so that each end portion of the first and second conductive parts 402 and 403 are not covered by the insulating part 401 in order to enable the electrical connection structure as described above.

In the FPCB 400, the first and second connection parts 421 and 422 are fixed to the portions of the upper and lower surfaces of the substrate 100 at which the first and second connection portions 311 and 321 are formed, respectively, to thereby be connected to the substrate 100. In this case, in order for the first and second connection parts 421 and 422 to be adhered and fixed to the upper and lower surfaces of the substrate 100, respectively, a first adhesive pad 431 may be formed at the end portion of the first conductive part 402, and a second adhesive pad 432 may be formed at the end portion of the second conductive part 403.

Here, the first and second adhesive pads 431 and 432 may be made of a conductive material such as an anisotropic conductive film (ACF), an anisotropic conductive adhesive (ACA), or the like, so that the first and second conductive parts 402 and 403 may be electrically connected to the first and second connection portions 311 and 321.

Since the first and second connection portions 311 and 321 are formed on the upper and lower surfaces of the substrate 100, respectively, so as to face each other in the vertical direction as described above, an assembling process of connecting the FPCB 400 formed as described above and the substrate 100 to each other may be completed as a single process of simultaneously adhering the first and second adhesive pads 431 and the 432 to the portions of the substrate 100 at which the first and second connection portions 311 and 321 are formed, respectively.

In other words, the first and second adhesive pads 431 and 432 may be simultaneously adhered to the portions of the substrate 100 at which the first and second connection portions 311 and 321 are formed, respectively, by a single process of pressing the first and second connection parts 421 and 422 in the vertical direction so as to approach each other.

Therefore, the connection structure 1 between a substrate and an FPCB for a touch panel according to the present embodiment may have advantages in that it may significantly improve convenience in assembling the touch panel and significantly decrease a lead time until the assembling is completed as compared with the case in which the first and second connection portions 311 and 321 are formed at positions misaligned with each other without facing each other on the upper and lower surfaces of the substrate 100, respectively.

Furthermore, since the FPCB 400 is adhered to portions of both surfaces at one point of the substrate 100 that face each other to thereby be connected to the substrate 100, a misalignment phenomenon or a bending phenomenon of the FPCB 400 is not generated in an assembling process as compared with the case in which the FPCB 400 is adhered to portions of both surfaces of the substrate 100 that do not face each other. Therefore, a connection state between the FPCB 400 and the substrate 100 may be firmly maintained.

Figure 3:
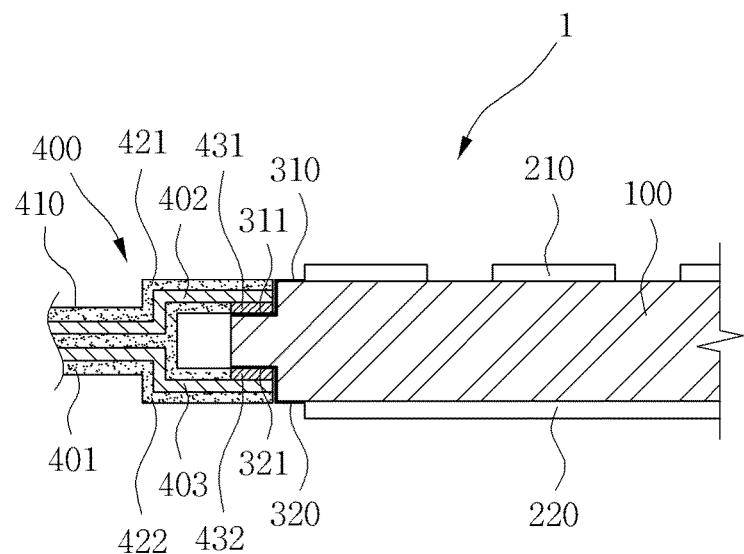
FIG. 3 is a side cross-sectional view of main portions of a connection structure between a substrate and an FPCB for a touch panel according to a second preferred embodiment of the present invention.
Figure 4:
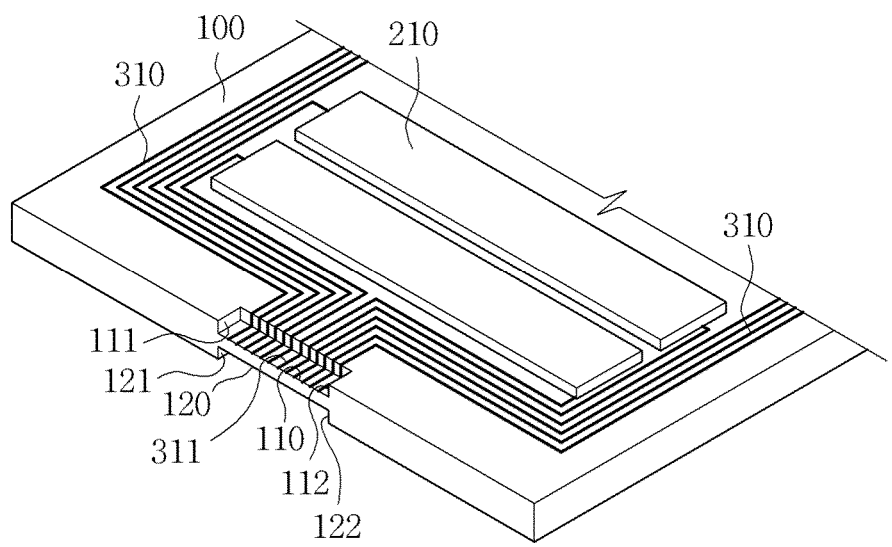
FIG. 4 is a perspective view of main portions of the substrate shown in FIG. 3.

A connection structure 2 between a substrate and an FPCB for a touch panel according to a second preferred embodiment of the present invention is shown in FIGS. 3 and 4.

The connection structure between a substrate and an FPCB for a touch panel according to the present embodiment is different in a shape of a substrate 100 from the connection structure between a substrate and an FPCB for a touch panel according the first preferred embodiment of the present invention described above. Therefore, the same components as the components described in the first preferred embodiment of the present invention except for the substrate will be denoted by the same reference numerals in the accompanying drawings, and a detailed description thereof will be replaced by the description of the first preferred embodiment of the present invention. In addition, hereinafter, only a portion corresponding to a configuration different from the configuration according to the first preferred embodiment of the present invention will be described in detail.

As shown in FIGS. 3 and 4, the connection structure 2 between a substrate and an FPCB for a touch panel according to the present embodiment is different from the connection structure 1 between a substrate and an FPCB for a touch panel according to the first preferred embodiment of the present invention in that a first depression part 110 is formed at the portion of the upper surface of the substrate 100 at which the first connection portion 311 is formed and a second depression part 120 is formed at the portion of the lower surface of the substrate 100 at which the second connection portion 321 is formed.

Generally, a protection plate (not shown) such as a window plate is disposed in an upper surface direction or a lower surface direction of the substrate 100 in order to protect the substrate 100 from an external environment. The protection plate is disposed in a state in which it is adhered to the substrate 100 by a transparent adhesive layer (not shown) formed between the protection plate and the substrate 100.

The transparent adhesive layer needs to be formed at the same thickness on the substrate 100 in a length direction of the substrate 100 so that the protection plate and the substrate 100 may be disposed in parallel with each other. Here, in the case in which the FPCB 400 is connected to the substrate 100 so as to be protruded on the substrate 100 as in the first preferred embodiment of the present invention, the transparent adhesive layer needs to be formed at a thickness equal to or larger than the height of the protruded FPCB 400. Therefore, the thickness of the transparent adhesive layer may unnecessarily become thick, which may be a limitation in thinning the touch panel.

Therefore, in the present embodiment, in order to solve this problem, in other words, in order to make the thickness of the transparent adhesive layer as thin as possible without limiting the connection structure between a substrate and an FPCB, an example in which the first and second depression parts 110 and 120 as described above are formed on the substrate 100 is suggested.

Here, the first connection portion 311 is formed on the first depression part 110, and the second connection portion 321 is formed on the second depression part 120, and the first and second connection portions 311 and 321 are formed on both surfaces of the substrate 100, respectively, so as to face each other in the vertical direction, similar to the first exemplary embodiment of the present invention. Therefore, the first and second depression parts 110 and 120 are also formed on both surfaces of the substrate 100, respectively, so as to face each other in the vertical direction.

In the present embodiment, the first connection part 421 of the FPCB 400 is inserted into and fixed to the first depression part 110, and the second connection part 422 thereof is inserted into and fixed to the second depression part 120.

The first and second depression parts 110 and 120 provide spaces into which the first and second connection parts 421 and 422 may be inserted as described above, such that the FPCB 400 is not protruded upwardly of the substrate 100 in a state in which it is connected to the substrate 100. Therefore, according to the present embodiment, the thickness of the transparent adhesive layer described above may be minimized and thinness of the touch panel may be realized.

Further, according to the present embodiment, the first and second connection parts 421 and 422 are inserted into the first and second depression parts 110 and 120, such that the first and second connection parts 421 and 422 are positioned to be connected to the first and second connection portions 311 and 321, thereby making it possible to easily perform an alignment operation of the FPCB 400.

Further, both sidewalls 111, 112, 121, and 122 of the first and second depression parts 110 and 120 serve as a guide limiting lateral movement of the first and second connection parts 421 and 422 inserted into the first and second depression parts 110 and 120, thereby making it possible to more effectively prevent misalignment of the FPCB 400 in an assembling process of the touch panel.

In addition, in the case in which the first and second connection parts 421 and 422 have widths corresponding to widths between the both sidewalls 111, 112, 121, and 122 of the first and second depression parts 110 and 120, the both sidewalls 111, 112, 121, and 122 of the first and second depression parts 110 and 120 serve as a guide so that the FPCB 400 may be accurately connected to the first and second connection portions 311 and 321 in an assembling process of connecting the FPCB 400 to the substrate 100, that is, the first and second connection parts 421 and 422 may be disposed at an accurate fixed position on the substrate 100.

According to the present embodiment, the first and second connection parts 421 and 422 are inserted into and fixed to the first and second depression parts 110 and 120 as described above, thereby making it possible to realize the thinness of the touch panel, improve the convenience in the assembling process, and prevent the misalignment of the FPCB 400 to improve the reliability of the signal transfer.

According to the preferred embodiment of the present invention, the connection portions of the electrode wirings connected to the FPCB are formed on the upper and lower surfaces of the substrate, respectively, to face each other, such that the connection parts of the FPCB connected to the connection portions of the electrode wirings may be connected to the substrate by a single assembling process in which they are pressed in the vertical direction.

Since the process of connecting the FPCB to the substrate may be completed as a single process regardless of whether the process is manually performed by an operator or is performed by a manufacturing process, the assembling convenience may be improved, the lead time until the assembling is completed may be decreased, and the number of manufacturing devices may be decreased.

Further, since the FPCB is connected to portions of both surfaces at one point of the substrate that face each other, misalignment or bending of the FPCB is not generated in an assembling process as compared with the case in which the FPCB is connected to different portions of both surfaces of the substrate that do not face each other.

Meanwhile, in the case in which the first and second depression parts are further formed in the substrate, the first and second connection parts are inserted into the first and second depression parts, respectively, such that they are not protruded upwardly of the substrate, thereby making it possible to realize the thinness of the touch panel.

Further, an alignment operation of positioning the first and second connection parts of the FPCB at the first and second connection portions may be easily performed.

Furthermore, the first and second depression parts serve as a guide preventing lateral movement of the first and second connection parts to more effectively prevent the misalignment of the FPCB, thereby making it possible to secure reliability of the signal transfer through the FPCB.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A touch module for sensing a touch having a flexible printed circuit board (FPCB) for a touch panel, comprising:
   a substrate;
   first touch sensing electrodes formed on an upper surface of the substrate;
   second touch sensing electrodes formed on a lower surface of the substrate;
   first electrode wirings formed on the upper surface of the substrate and electrically connected to the first touch sensing electrodes;
   second electrode wirings formed on the lower surface of the substrate and electrically connected to the second touch sensing electrodes; and
   a flexible printed circuit board connected to the substrate so as to be electrically connected to the first and second electrode wirings,
   wherein a first connection portion of the first electrode wiring and a second connection portion of the second electrode wiring to which the flexible printed circuit board is electrically connected are formed on the upper and lower surfaces of the substrate, respectively, so as to face each other in a vertical direction; and
   wherein the substrate, the first and second touch sensing electrodes are substantially transparent.

2. The touch module of claim 1, wherein the first and second connection portions are formed on upper and lower surfaces of a distal end portion of the substrate, respectively.

3. The touch module of claim 1, wherein the flexible printed circuit board includes:
   a body part; and
   first and second connection parts extended integrally with each other from the body part and electrically connected to the first and second connection portions, respectively.

4. The touch module of claim 3, wherein the flexible printed circuit board includes:
   an insulating part enclosing the outermost side; and
   first and second conductive parts formed in the insulating part and electrically connected to the first and second connection portions, respectively.

5. The touch module of claim 4, wherein the flexible printed circuit board further includes:
   a first adhesive pad formed at an end portion of the first conductive part and adhered to a portion of the substrate at which the first connection portion is formed and electrically connected to the first connection portion; and a second adhesive pad formed at an end portion of the second conductive part and adhered to a portion of the substrate at which the second connection portion is formed and electrically connected to the second connection portion.

6. The touch module of claim 3, further comprising:
   a first depression part having the first connection portion formed thereon and depressed from the upper surface of the substrate in a thickness direction; and
   a second depression part having the second connection portion formed thereon and depressed from the lower surface of the substrate in the thickness direction.

7. The touch module of claim 6, wherein the first and second connection parts have widths corresponding to widths between both sidewalls of each of the first and second depression parts.

8. A connection structure between a substrate and a flexible printed circuit board (FPCB) for a touch panel, comprising:
   a substrate;
   first sensing electrodes formed on an upper surface of the substrate;
   second sensing electrodes formed on a lower surface of the substrate;
   first electrode wirings formed on the upper surface of the substrate and electrically connected to the first sensing electrodes;
   second electrode wirings formed on the lower surface of the substrate and electrically connected to the second sensing electrodes;
   a flexible printed circuit board connected to the substrate so as to be electrically connected to the first and second electrode wirings;
   a first depression part having the first connection portion formed thereon and depressed from the upper surface of the substrate in a thickness direction; and
   a second depression part having the second connection portion formed thereon and depressed from the lower surface of the substrate in the thickness direction,
   wherein a first connection portion of the first electrode wiring and a second connection portion of the second electrode wiring to which the flexible printed circuit board is electrically connected are formed on the upper and lower surfaces of the substrate, respectively, so as to face each other in a vertical direction, and
   wherein the flexible printed circuit board includes:
   a body part; and first and second connection parts extended integrally with each other from the body part and electrically connected to the first and second connection portions, respectively.

9. The connection structure of claim 8, wherein the first and second connection parts have widths corresponding to widths between both sidewalls of each of the first and second depression parts.

* * * * *